(12) United States Patent  (10) Patent No.: US 6,465,278 B2
Russell                    (45) Date of Patent:    Oct. 15, 2002

(54) METHOD AND APPARATUS FOR DELIVERING ELECTRICAL POWER TO A SEMICONDUCTOR DIE

(75) Inventor: Ernest J. Russell, Richmond, TX (US)

(73) Assignee: Texas Instruments Incorporated, Dallas, TX (US)

(*) Notice: Subject to any disclaimer, the term of this patent is extended or adjusted under 35 U.S.C. 154(b) by 101 days.

(21) Appl. No.: 09/795,456

(22) Filed: Mar. 1, 2001

(65) Prior Publication Data

US 2001/0005039 A1 Jun. 28, 2001

Related U.S. Application Data

(62) Division of application No. 09/205,566, filed on Dec. 4, 1998, now Pat. No. 6,268,643.
(60) Provisional application No. 60/068,390, filed on Dec. 22, 1997.

(51) Int. Cl.$^7$ .................................. H01L 21/00
(52) U.S. Cl. .................. 438/123; 438/123; 438/106; 438/121; 257/666; 257/673; 257/692; 257/734
(58) Field of Search ................... 438/106, 121, 438/123

(56) References Cited

U.S. PATENT DOCUMENTS

| 5,455,200 | A | * | 10/1995 | Bigler et al. ............... 437/220 |
| 5,648,680 | A |   | 7/1997  | Ogawa et al. ............. 257/666 |
| 5,907,186 | A | * | 5/1999  | Kang et al. ................ 257/676 |
| 5,945,728 | A |   | 8/1999  | Dobkin et al. ............. 257/666 |
| 5,977,614 | A | * | 11/1999 | Takeuchi .................... 257/666 |
| 6,114,627 | A | * | 9/2000  | Moden ....................... 174/52.4 |

* cited by examiner

*Primary Examiner*—Charles Bowers
*Assistant Examiner*—Scott B Geyer
(74) *Attorney, Agent, or Firm*—Robby T. Holland; Wade James Brady, III; Frederick J. Telecky, Jr.

(57) ABSTRACT

A method and apparatus for delivering electrical power to a semiconductor die is provided in which a metal frame (104) is applied to the top surface of a semiconductor die. The metal frame include two voltages leads (106, 108), each adjacent to each series of bond pads (116) formed on the top surface of the Semiconductor die. Each voltage lead includes a longitudinal portion (122) adjacent bond pads (116) in the center of the semiconductor die and corner portions (124) or arm portions (125) adjacent bond pads (116) located in the quadrants (114) of the semiconductor die.

7 Claims, 2 Drawing Sheets

METHOD AND APPARATUS FOR DELIVERING ELECTRICAL POWER TO A SEMICONDUCTOR DIE

CROSS REFERENCE TO PRIOR APPLICATIONS

This application is a division of Ser. No. 09/205,566 filed Dec. 4, 1998 now U.S. Pat. No. 6,268,643 which claims priority from Provisional Application Ser. No. 60/068,390, filed Dec. 22, 1997.

TECHNICAL FIELD OF THE INVENTION

The present invention relates in general to semiconductor devices and more particularly to an apparatus and method for delivering electrical power to the bond pads of a semiconductor die.

BACKGROUND OF THE INVENTION

An important consideration in the packaging of integrated circuits is the efficient delivery of power and ground feeds to the semiconductor die of the integrated circuit. One method for the delivery of power to the integrated circuit involves lead frame over chip (LOC) packaging, in which a metal lead frame rests on top of the semiconductor die. The metal lead frames employed in LOC packaging often include two metal power buses, one power bus at a positive voltage potential and the other at a ground voltage potential. Each bus or metal lead runs lengthwise along the top of the semiconductor die. The power buses provide a means by which the bond wires can be easily coupled between the power buses and the bond pads, which bond pads often lie in the center top surface of the semiconductor die. In a typical configuration, there may be half a dozen or more connections made between the bond pads of the semiconductor die and the power buses.

One drawback of LOC packaging for delivering power to the die is the capacitive effects created by the combination of the metal lead frame and the semiconductor die. In the configuration described, both the semiconductor die and the metal lead frame behave as capacitor plates, producing capacitive effects on the signals being output from the semiconductor die. The signals being transferred to and from the semiconductor die often have to switch between potential levels, and the capacitive effects produced by the combination of the semiconductor die and the lead frame tend to inhibit the fast switching between voltage potentials because of the damping effects experienced during the transition between voltage levels.

To compensate for capacitive effects created by the combination of the semiconductor die and the metal lead frame, integrated circuit designers have designed chips in which the signals that are most sensitive to parasitic capacitance, such as high frequency output signals in memory chips, and the bond pads for these signals have been moved to the four corners of the semiconductor die. In this manner, the output signals leaving the semiconductor die from the four corners of the chip are between the metal lead frame and the semiconductor die—the two plates producing capacitive effects—for only a very short distance, thereby reducing the capacitive loading on the signals that are most sensitive to parasitic capacitance. An additional benefit of placing the output signals on the four corners of the semiconductor die is a reduction in the distance that the signal must travel on the bond wires and on the lead frame before reaching the outside of the integrated circuit packaging.

If bond pads and output signals are placed on the outside corners of the semiconductor die, however, dedicated output drivers ordinarily must be placed adjacent the bond pads to drive the output signals. These output drivers, however, often require massive and dedicated power and ground feeds.

SUMMARY OF THE INVENTION

In accordance with the present invention, a method and apparatus for delivering power to a semiconductor die is provided that substantially eliminates or reduces problems associated with previously developed power delivery methods..

The method and apparatus involve a lead frame that is coupled to the surface of a semiconductor die. A series of bond pads are formed on the surface of the semiconductor die in each of the corners of the semiconductor die. The metal frame includes first and second voltage leads. These leads are formed to have two corner portions and two arm portions so that each of the voltage leads is adjacent to the series of bond pads in each of the four corners of the semiconductor die.

A technical advantage of the present invention is that both voltage leads of the metal frame are adjacent to each series of bond pads formed on the semiconductor die, including the bond pads on the outer edges of the semiconductor die, allowing the signals from the bond pads on the outer edges of the semiconductor die to be closest physically to the signal leads of the lead frame and the exterior of the integrated circuit packaging.

Another technical advantage of the present invention is that the first and second voltage leads are physically adjacent one another, thereby introducing capacitive effects that aid the stability of the voltage potentials delivered by the first and second voltage leads.

Still another technical advantage of the present invention is that power is delivered to the bond pads of the semiconductor die substantially along the length of the voltage leads, which have greater electrical conductivity as compared to the bond wires coupling the bond pads to the voltage leads.

Another technical advantage of the present invention is the provision of a metal frame that allows voltages to be delivered to the corners as well as the center of a semiconductor die in a manner that removes the need to have power circuitry included in the integrated circuitry of the semiconductor die.

Additional technical advantages should be readily apparent from the drawings, description, and claims.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

Figure 1:
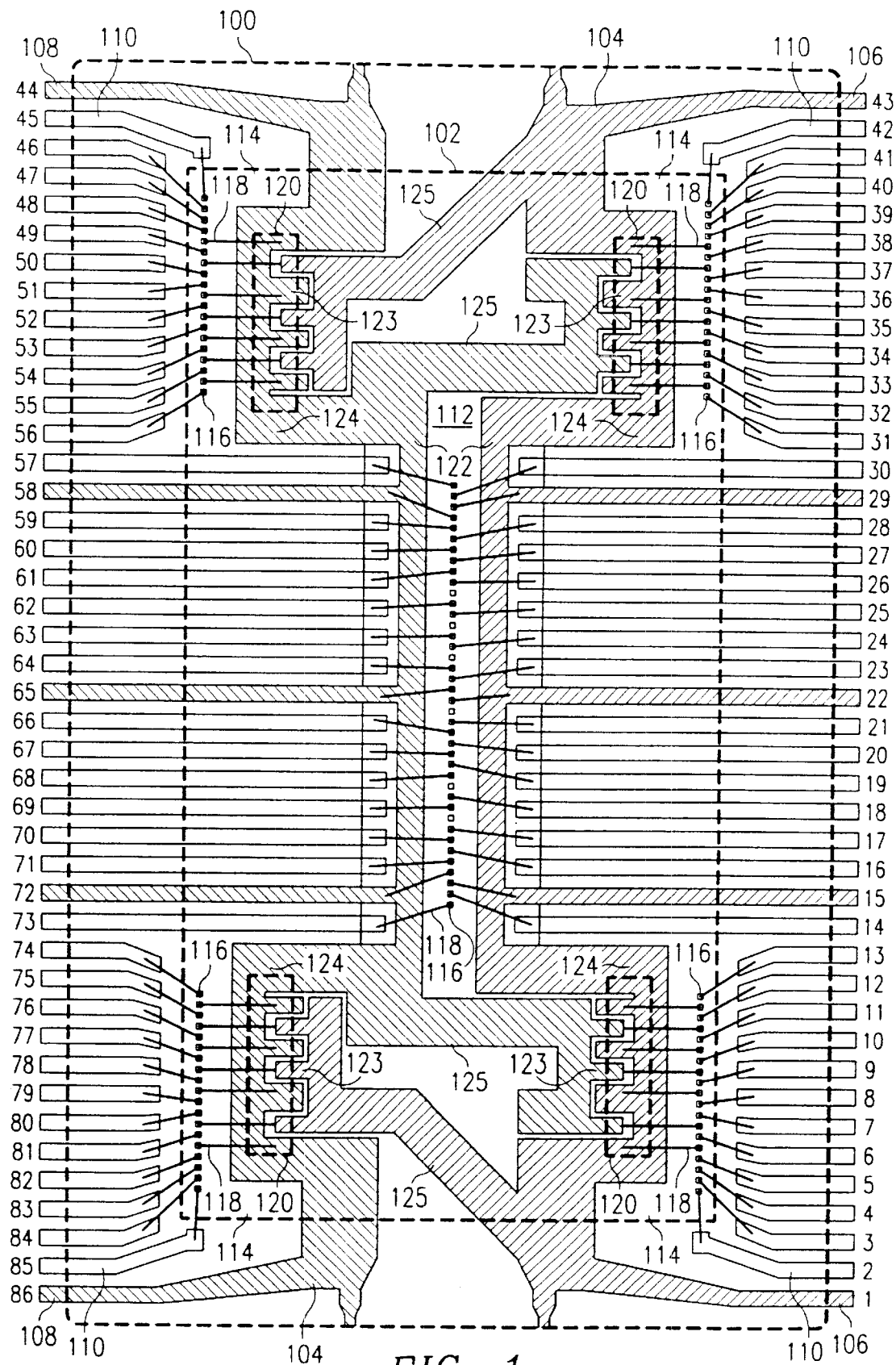
FIG. 1 is a top view, in cross-section, of the integrated circuit packaging, lead frame, and semiconductor die of the present invention.

Shown in FIG. 1 is the outline 100 of the packaging of integrated circuit 102. Overlaid above integrated circuit 102 is a lead frame 104. Lead frame 104 includes a total of 86 leads, numbered sequentially from 1 to 86. Among these leads are first and second voltage leads, 106 and 108. The remainder of the leads are identified generally as signal leads 110. Signal leads 110 may carry signals representing I/O, data, control, or clock signals, depending on the particular design or function of integrated circuit 102. Integrated circuit 102 may comprise, for example, a 256 MB SDRAM memory chip.

The first voltage lead 106 is a power lead. Power lead 106 acts as a power bus and extends from lead 1 to lead 43. Second voltage lead 108 is a ground lead. Ground lead 108 acts as a ground bus and extends from lead 44 to lead 86. Voltage lead 106 and ground lead 108 are shaded to distinguish them from signal leads 110. Voltage lead 106 has ends at leads 1 and 43 of lead frame 104. Ground lead 108 has ends at leads 44 and 86 of lead frame 104. Integrated circuit 102 includes a center portion 112 and four quadrants 114. Each of the center portion 112 and the four quadrants 114 includes a number of bond pads 116. Bond pads 116 are coupled to the leads of lead frame 104 by bond wires 118.

A piece of polyamide tape 120 acts as a contact surface between the top surface of integrated circuit 102 and lead frame 104. The polyamide tape is placed between integrated circuit 102 and lead frame 104 in those areas of the top surface of integrated circuit 102 where the bond wires make connections to the power lead 106 and the ground lead 108.

In the embodiment of FIG. 1, the bond pads 116 that output the most output signals of integrated circuit 102 that are most sensitive to parasitic capacitance are located on the outer edges of integrated circuit 102 in each of the four quadrants 114. The placement of selected bond pads 116 and their corresponding output signals near the outer edges of integrated circuit 102 reduces the capacitive effects experienced by the signals carried on bond wires 118. Integrated circuit 102 and lead frame 104 act as two plates of a capacitor. Because bond pads 116 and their corresponding output signals are located near the edges of integrated circuit 102, the signals carried in bond wires 118 are physically between integrated circuit 102 and lead frame 104 for only a very short distance, thereby reducing the capacitive effects experienced by the signals in bond wires 118 that are destined for signal leads 110.

The design of the lead frame 104 of the present invention allows the lead frame to supply the voltage and ground feeds necessary to drive the output signals that are output at bond pads 116 in the four quadrants 114 of integrated circuit 102. Lead frame 104 includes a power lead 106 and a ground lead 108 that are configured in such a,way that both the power lead 106 and the ground lead 108 are placed in close proximity to bonds pads 116 in the both the center portion 112 and the quadrants 114 of integrated circuit 102. Each of the power lead 106 and ground lead 108 includes a center bus or longitudinal portion 122. Center bus 122 of power lead 106 and ground lead 108 delivers power at voltage or ground potentials to the bond pads 116 located in the center portion 112 of integrated circuit 102.

In addition, each of power lead 106 and ground lead 108 includes two corner portions 124 that deliver power at either voltage or ground potentials to the bond pads 116 located in the quadrants 114 of integrated circuit 104. The two corner portions 124 of power lead 106 are located nearest leads 1 and 43, and the two corner portions 124 of ground lead 108 are located nearest leads 44 and 86. The two corner portions 124 of power lead 106 and ground lead 108 are arranged in a U shape. The U shape of the corner portions 124 of leads 108 and 106 allow the leads to be near the bond pads 116 that are located in the quadrants 114 of the integrated circuit 102. Despite the U shape of the leads 108 and 106 in the quadrants 114 of integrated circuit 102, power lead 106 and ground lead 108 each have a longitudinal shape in their center that allows them to be near the bond pads 116 in the center portion of integrated circuit 102. The corner portions 124 of power lead 106 and ground lead 108 each include a plurality of interlocking fingers 123 that protrude from each of the corner portions 124 in the direction opposite bond pads 118. Fingers 123 provide an area for coupling bond wires 116 to power lead 106 and ground lead 108.

Each of the power lead 106 and the ground lead 108 includes two arms 125. Each of the arms 125 extend to deliver power at voltage or ground potentials to the bond pads 116 that are opposite the ends of the respective power lead 106 or ground lead 108. As an example, in the drawing of FIG. 1, arms 125 of power lead 106 deliver power to the bond pads 116 nearest leads 44 and 86, and the arms 125 of ground lead 108 deliver power to the bond pads 116 nearest leads 1 and 43. In this configuration, arms 125 of power lead 106 and ground lead 108 allow the power bus 108 and ground bus 106 to be in close proximity to the bond pads 116 that are located in the quadrants 114 of integrated circuit 102 that are opposite the ends of the respective power lead 106 or ground lead 108. It should be noted that arms 125 are positioned differently along the length of power lead 106 as compared to ground lead 108. Following the length of power lead 106 from lead to lead 43, arm 125 is positioned prior to the first corner portion 124 and after the second corner portion. 124. Following the length of ground lead 108 from lead 44 to lead 86, arm 125 is positioned after the first corner portion 124 and prior to the second corner portion 124. Each of arms 125 include a plurality of fingers 123 at the ends of arm 125. The fingers 123 of arms 125 of power lead 106 interlock with the fingers 123 of the corner portion 124 of ground lead 108, and the fingers 123 of arms 125 of ground lead 108 interlock with the fingers 123 of the corner portion 124 of power lead 106.

As shown in FIG. 1, power bus 106 and ground bus 108 are positioned so that each is located in close proximity to the bond pads 116 located in each of the four quadrants 114 and center portion 112 of integrated circuit 102. Placing the power bus 108 and ground bus 106 as near as possible to bond pads 116 yields faster and more reliable electrical performance because the length of the bond wire 118 needed to couple the bond pad 116 to the power bus 108 or ground bus 106 is reduced and the power and ground voltage potentials are delivered primarily over the power lead 106 and ground lead 108, which have much greater electrical conductivity than bond wires 118.

Figure 2:
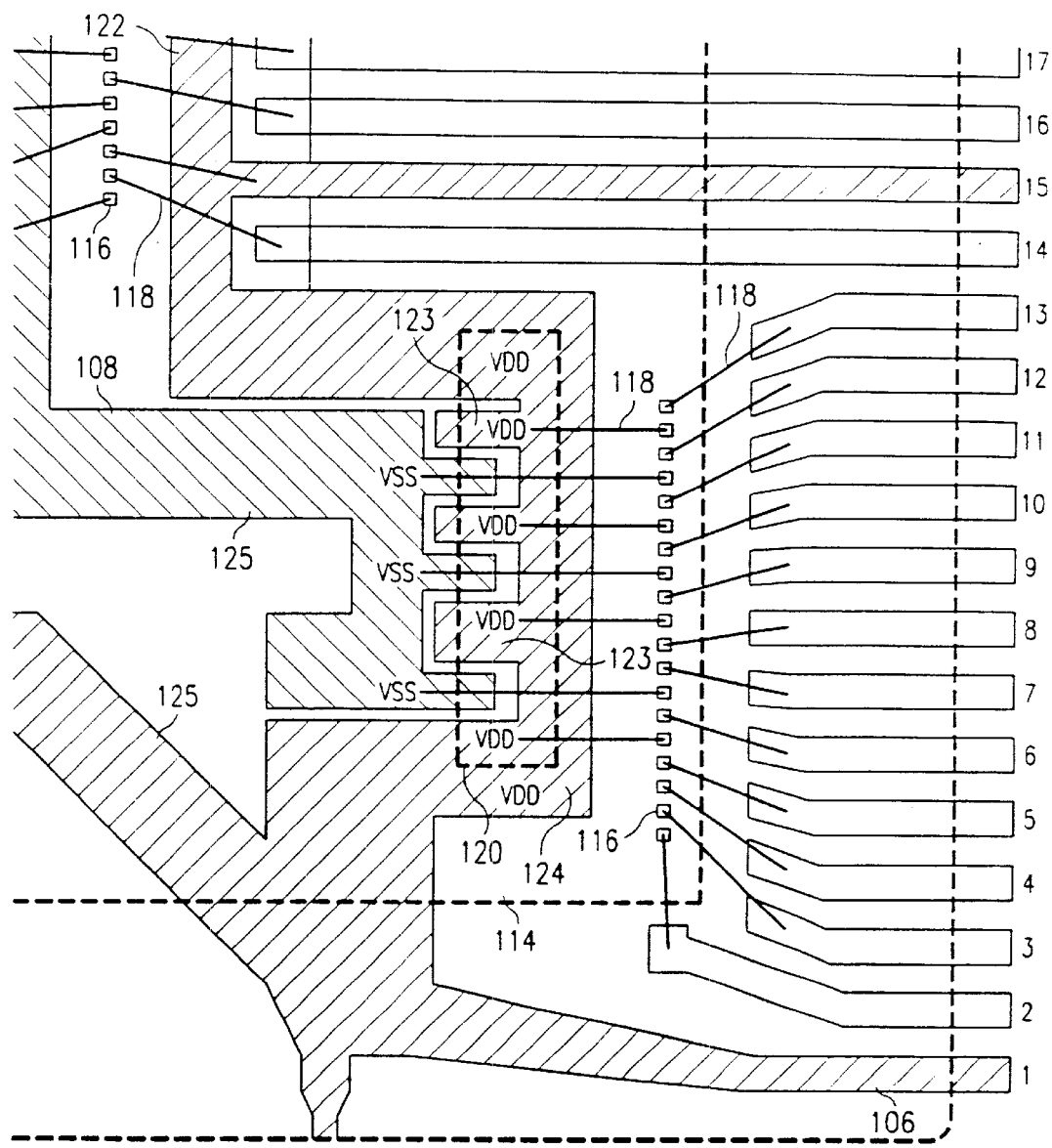
FIG. 2 is an enlargement of a quadrant of FIG. 1.

Shown in FIG. 2 is an enlargement of a quadrant 114 of integrated circuit 102 of FIG. 1. Shown in FIG. 2 are leads 1 through 16, including power lead 106 at lead 1. Shown in quadrant 114 are bond pads 116, which are coupled by bond wires 118 to the leads 2 through 13 and the fingers 12.3 and 125 of power lead 106 and ground lead 108. Also shown are arm 125 of power lead 106 and ground lead 108. The outline of polyamide tape 120 is shown in the area where bond wires 118 are coupled to power lead 106 and ground lead 108.

As can be seen from FIG. 2, the corner portion 124 of power lead 106, including the fingers 123 of power lead 106, is very near to the arm 125 of ground lead 108, including the fingers 123 of ground lead 108. The placement of the corner portion 124 of power lead 106 in close proximity to the arm 125 of ground lead 108, and the placement of the fingers 123 of ground lead 108 in close proximity to the fingers 123 of power lead 106 produces capacitive effects between the power lead 106 and the ground lead 108. The capacitive effects produced by the power lead 106 and ground lead 108 act as a buffer to change in the voltage potentials provided by power lead 106 and ground lead 108. Because the voltages provided in power lead 106 and ground lead 108 do not switch between voltage levels, the capacitive effects created by the close proximity of power lead 106 and ground lead 108 are an aid to the maintenance of a constant voltage potential in each of power lead 106 and ground lead 108. Power lead 106 and ground lead 108 are also placed in close proximity in the center portion of integrated circuit 102, producing the same beneficial capacitive effects as experienced in the four quadrants 114 of integrated circuit 102.

The lead frame 104 of the present invention is configured in such a manner that the power lead 106 and the ground lead 108 are positioned that each of the power lead 106 and the ground lead 108 is in close proximity to each of the bond pads 116 of integrated circuit 102, and so that the power lead 106 and the ground lead 108 are in close proximity to one another thereby taking advantage of the beneficial capacitive effects produced by the proximity of the leads.

Although the present invention has been described in detail, it should be understood that various changes, substitutions and alterations can be made hereto without departing from the spirit and scope of the invention as defined by the appended claims.

What is claimed is:

1. A method for coupling a lead frame to a semiconductor die, the lead frame having first and second voltage leads and a plurality of signal leads, comprising the steps of:
   providing a semiconductor die having an integrated circuit, said semiconductor die having four corners and a top surface;
   forming in groups a plurality of bond pads in each of the four corners of the top surface of the semiconductor die;
   providing a lead frame having a plurality of signal leads and said first and second voltage leads;
   coupling the lead frame to the top surface of the semiconductor die such that the first and second voltage leads of the lead frame are each coupled at each of the four corners of the semiconductor die adjacent to a said bond pad of the semiconductor die, each of said pair of voltage leads having a portion which extends on said die to each said corner and is in proximity with the other of said voltage leads and is interleaved with portions of said other of said leads at each said corner; and
   coupling a plurality of bond wires from the bond pads of the semiconductor die to the first and second voltage leads of the lead frame.

2. The method for coupling a lead frame to a semiconductor die of claim 1, wherein the first voltage lead delivers power at a positive voltage potential and the second voltage lead delivers power at a ground voltage potential.

3. The method for coupling a lead frame to a semiconductor die of claim 1, further comprising the steps of:
   forming a plurality of bond pads in the center of the top surface of the semiconductor die;
   coupling the lead frame to the top surface of the semiconductor die such that the first and second voltage leads are positioned adjacent each other and adjacent the bond pads formed in the center of the top surface of the semiconductor die; and
   coupling a plurality of bond wires from the bond pads formed in the center of the semiconductor die to the first and second voltage leads of the lead frame.

4. The method of coupling a lead frame to a semiconductor die of claim 1, wherein the first and second voltage leads each includes a corner portion having fingers extending therefrom and an arm portion having fingers extending therefrom, and wherein the lead frame is coupled to the top surface of the semiconductor die such that the fingers of the corner portions of the first voltage lead interlock with the fingers of the arm portions of the second voltage lead, and wherein the fingers of the arm portion of the first voltage lead interlock with the fingers of the corner portion of the second voltage lead.

5. The method of coupling a lead frame to a semiconductor die of claim 1, further comprising the steps of:
   forming a plurality of bond pads in the center of the top surface of the semiconductor die;
   coupling the lead frame to the top surface of the semiconductor die such that the first and second voltage leads are positioned adjacent each other and adjacent the bond pads formed in the center of the top surface of the semiconductor die; and
   coupling a plurality of bond wires from the bond pads formed in the center of the semiconductor die to the first and second voltage leads of the lead frame;
   wherein the first and second voltage leads each includes a corner portion having fingers extending therefrom and an arm portion having fingers extending therefrom, and wherein the lead frame is coupled to the top surface of the semiconductor die such that the fingers of the corner portions of the first voltage lead interlock with the fingers of the arm portions of the second voltage lead, and wherein the fingers of the arm portion of the first voltage lead interlock with the fingers of the corner portion of the second voltage lead.

6. The method of coupling a lead frame to a semiconductor die of claim 1 wherein the lead frame is coupled to the top surface of the semiconductor die applying the lead frame to polyamide tape coupled to the top surface of the semiconductor die.

7. The method of coupling a lead frame to a semiconductor die of claim 1, further comprising the steps of:
   forming a plurality of bond pads in the center of the top surface of the semiconductor die;
   coupling the lead frame to the top surface of the semiconductor die such that the first and second voltage leads are positioned adjacent each other and adjacent the bond pads formed in the center of the top surface of the semiconductor die; and
   coupling a plurality of bond wires from the bond pads formed in the center of the semiconductor die to the first and second voltage leads of the lead frame;
   wherein the first and second voltage leads each includes a corner portion having fingers extending therefrom and an arm portion having fingers extending therefrom, and wherein the lead frame is coupled to the top surface of the semiconductor die such that the fingers of the corner portions of the first voltage lead interlock with the fingers of the arm portions of the second voltage lead, and wherein the fingers of the arm portion of the first voltage lead interlock with the fingers of the corner portion of the second voltage lead; and
   wherein the lead frame is coupled to the top surface of the semiconductor die applying the lead frame to polyamide tape coupled to the top surface of the semiconductor die.

* * * * *